United States Patent [19]

Konno

[11] Patent Number: 5,637,906

[45] Date of Patent: Jun. 10, 1997

[54] MULTI LAYER THIN FILM MAGNETIC SENSOR

[75] Inventor: Hideto Konno, Tokyo, Japan

[73] Assignee: NEC Corporation, Tokyo, Japan

[21] Appl. No.: 500,831

[22] Filed: Jul. 11, 1995

[30]  Foreign Application Priority Data

Jul. 11, 1994 [JP] Japan ..................... 6-157763

[51] Int. Cl.$^6$ .................... H01L 29/82; H01L 43/00
[52] U.S. Cl. ...................... 257/421; 338/32 R
[58] Field of Search ................ 257/421; 338/32 R

[56]  References Cited

U.S. PATENT DOCUMENTS

| 5,476,680 | 12/1995 | Coffey et al. | 427/130 |
| 5,500,633 | 3/1996 | Saito et al. | 338/32 R |

FOREIGN PATENT DOCUMENTS 54-41335  12/1979  Japan .

OTHER PUBLICATIONS

"Anisotropic Magnetoresistance in Ferromagnetic 3d Alloys", IEEE Trans. Mag, Mag–11, No.4, P1018 (Jul., 1975).

Primary Examiner—Wael Fahmy
Assistant Examiner—Fetsum Abraham
Attorney, Agent, or Firm—Scully, Scott, Murphy and Presser

[57]  ABSTRACT

A detecting region of a magnetic sensor, for converting magnetic signal from a magnetized member into an electric signal and detecting a moving condition of the magnetized member on the basis of the electric signal has a laminated structure of a first and second magnetic layers each formed of a lamination of ultra thin films of a magnetic material and an intermediate non-magnetic layer formed of a lamination of ultra thin films of a non-magnetic material and disposed between the first and second magnetic layers. Particularly, thickness of each of the first and second magnetic layers is in a range from 3 nm to 10 nm and thickness of the intermediate non-magnetic layer is 3 nm or more. In a concrete example of the laminated structure, each of the first and second magnetic layers is composed of a lamination of atomic layers of nickel (Ni), iron (Fe) or an alloy of iron and nickel and the intermediate non-magnetic layer is composed of a lamination of 13 atomic layers or more of silver (Ag). The magnetic sensor has a magnetoresistance change rate which is considerably larger than that of a conventional sensor.

12 Claims, 8 Drawing Sheets

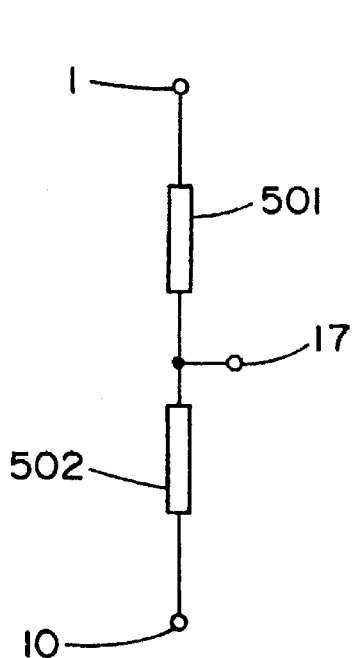
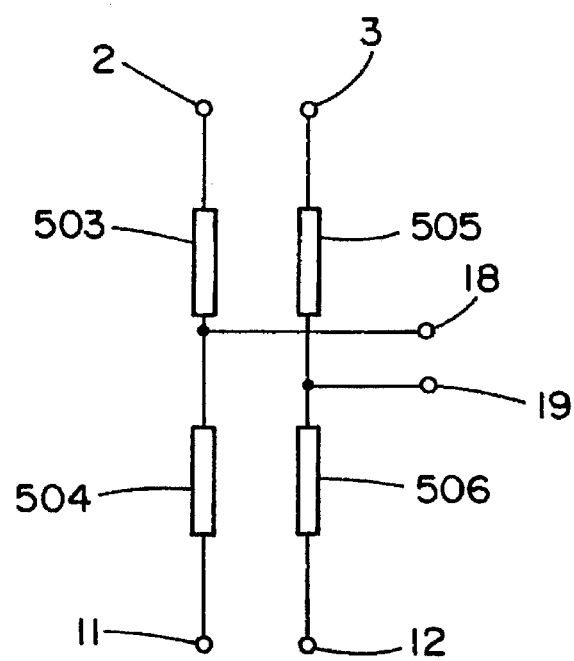
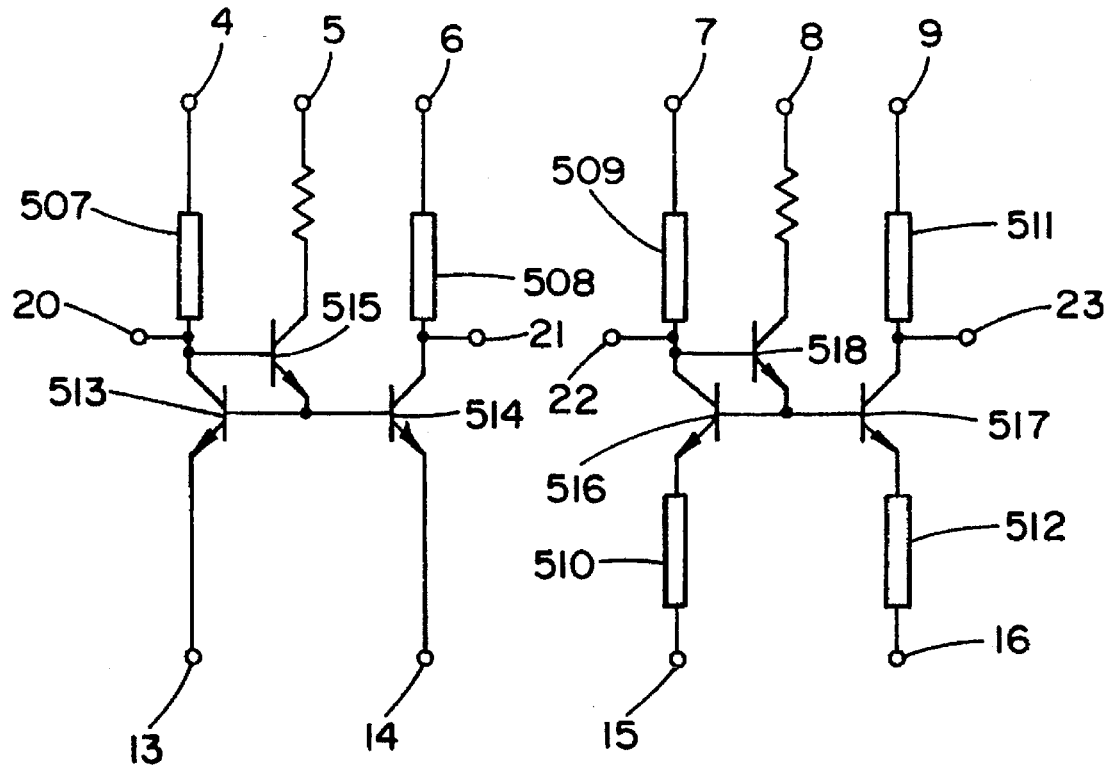
FIG.5(a)   FIG.5(b)   FIG.5(c)   FIG.5(d)

MULTI LAYER THIN FILM MAGNETIC SENSOR

BACKGROUND OF THE INVENTION

1. Field of the Invention

The present invention relates to a magnetic sensor and, particularly, to a magnetic sensor including an multi layer thin film which is a lamination of ultra thin films.

2. Description of Related Art

An example of a conventional thin film magnetic sensor of this kind is disclosed in Japanese Patent Publication No. S54-41335 specification. Among other conventional thin film magnetic sensors, a magnetic sensor which uses a single layer of a ferromagnetic thin film to utilize the magnetoresistance effect inherent thereto and obtains an output by specifically patterning the ferromagnetic film has been known.

The above-mentioned thin film magnetic sensor merely utilizes the anisotropic magnetoresistance effect of ferromagnetic thin film. Therefore, an output characteristics thereof depends upon rate of change of magnetoresistance, $\Delta R/R$, which is calculated from crystal parameters of material. Further, the rate of change of magnetoresistance is at most 6.5% at room temperature as disclosed in, for example, T. R. McGuire and R. I. Potter, "Anisotropic Magnetoresistance in Ferromagnetic 3d Alloys", IEEE Trans. Mag, Mag-11, No. 4, P1018 (1975).

In order to obtain a large magnetoresistance change rate $\Delta R/R$ in the conventional thin film magnetic sensor, it is necessary to employ either one of methods of lowering temperature, making a pattern width of the film considerably large and making a film thickness very large. However, variable range of the pattern width or the film thickness is about 1 to 2% at most when temperature is fixed at room temperature.

The sensitivity of the magnetic sensor in detecting magnetization intensity of a medium to be detected depends upon the magnetoresistance change rate $\Delta R/R$. Therefore, it is impossible to detect a moving state thereof precisely when the value of the magnetoresistance change rate is small.

SUMMARY OF THE INVENTION

An object of the present invention is to provide a magnetic sensor having a considerably larger magneto-resistance change rate and higher sensitivity compared with a conventional magnetic sensor.

A thin film magnetic sensor according to the present invention is featured by that a detecting region of the sensor, which is adapted to detect a moving condition of a magnetized member by converting a magnetic signal from the magnetized member into an electric signal, has a laminated structure of a first magnetic layer formed of a lamination of ultra thin films of a magnetic material, an intermediate non-magnetic layer formed of a lamination of ultra thin films of a non-magnetic material and a second magnetic layer formed of a lamination of ultra thin films of a magnetic material.

The magnetic sensor according to the present invention which has the structure mentioned above is featured by that thickness of each of the first and second magnetic layers is not smaller than 3 nm and not larger than 10 nm and thickness of the intermediate non-magnetic layer is not smaller than 3 nm.

In a concrete example of the laminated structure of the detecting region, each of the first and second magnetic layers is composed of a lamination of atomic layers of nickel (Ni), iron (Fe) or an alloy of iron and nickel and the intermediate non-magnetic layer is composed of a lamination of 13 atomic layers or more of silver (Ag).

In a case where the magnetic sensor is formed on a chip in which an integrated circuit is formed, the above-mentioned layers are formed on a substrate in which bipolar transistors and/or MOS transistors are preliminarily formed, through an insulating film of such as silicon nitride (SiN). Then, these layers are connected to the integrated circuit portions through through-holes preliminarily provided in the insulating film.

The magnetic sensor according to the present invention facilitates a control of coercive force (HC) thereof by the employment of the lamination of the magnetic layers and the intermediate non-magnetic layer, each of which takes in the form of a ultra thin film. The coercive force HWC of a multi layer thin film W having a laminated structure of two kinds of magnetic layers A and B each in the form of ultra thin film is a function of HCA, HCB, MA and MB, where HCA and HCB are coercive forces of the respective layers A and B and MA and MB are magnetic moments of the respective layers A and B.

Further, it is possible to control the B-H magnetization loop of the sensor by changing the combination of thin films forming the lamination structure of the sensor or regulating the thickness of the respective layers. That is, it is possible to provide a simple rectangular B-H loop by the control of the HC value mentioned above. In addition, starting from the simple rectangular loop, it is possible to obtain a magnetization loop in which magnetization is progressed in 2 steps, providing minor loops, respectively.

Further, the magnetic sensor according to the present invention does not utilize the anisotropic magnetoresistance effect of ferromagnetic thin film, unlike the conventional sensor such as disclosed in the Japanese Patent Publication No. S54-41335. The present invention is based on the giant magnetoresistance effect which changes the magnetoresistance according to the degree of scattering of valence electrons of respective electron spin, up spin and down spin. Thus, in the present invention, the magnetoresistance change rate $\Delta R/R$ is not determined substantially within the range from 3 to 4% by material properties as in the past. It is possible, according to the present invention, to obtain the magnetoresistance change rate of 10% or more.

BRIEF DESCRIPTION OF THE DRAWINGS

The above and other objects, features and advantages of the present invention will become more apparent from the following detailed description when taken in conjunction with the accompanying drawings wherein:

FIG. 5 shows an example of a magnetoelectric conversion circuit to be used with the magnetic sensor according to the present invention;

DETAILED DESCRIPTION OF THE PREFERRED EMBODIMENTS

A construction of an multi layer thin film magnetic sensor according to the present invention will be described in detail with reference to the drawings.

Figure 1:
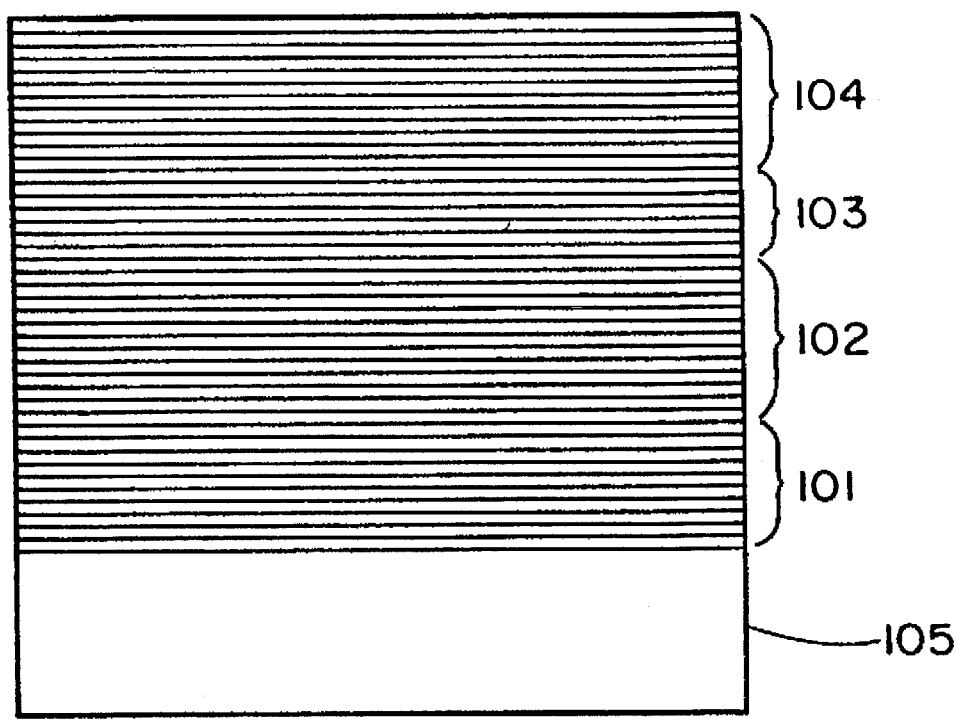
FIG. 1 is a cross section of a magnetic sensor according to the present invention, showing a lamination structure thereof.

FIG. 1 is a cross section of an artificial lattice laminated film obtained by growing magnetic layers and a non-magnetic layer on a flat (100) plane of a silver (Ag) substrate or a flat (100) plane of a monocrystalline substrate of such as GaAs. The growing method of these layers may be MBE (Molecular Beam Epitaxy) or sputtering at about $1 \times 10^{-10}$ Torr, under conditions which allows uniform films to be grown with smooth interfaces therebetween.

In this embodiment, an iron (Fe) layer 101 composed of a stack of 10 atomic layers, a silver (Ag) layer 102 composed of a stack of 15 atomic layers, an iron layer 103 composed of a stack of 6 atomic layers and a nickel (Ni) layer 104 composed of a stack of 13 atomic layers or more are grown continuously on a substrate 105, in the order. The silver layer 102 serves as an intermediate non-magnetic layer for controlling the magnetic coupling between the iron layer 101 as a lower magnetic layer and a combination of the iron layer 103 and the nickel layer 104 as an upper magnetic layer. Particularly, the nickel layer 104 is made as thick as 13 atomic layers or more in order to prevent the coupling.

The magnetic Fe layer 101 is substantially controlled in thickness to a value corresponding to 10 atomic layers and the combination of the magnetic layers 103 and 104 are substantially controlled in thickness to a value corresponding to 19 (=6+13) atomic layers. Incidentally, the coupling energy in this system is as small as 0.005 erg/cm². Therefore, the magnetization curve thereof includes a plurality of steps clearly indicating the HC of the respective magnetic layers as shown in FIG. 2.

Figure 2:
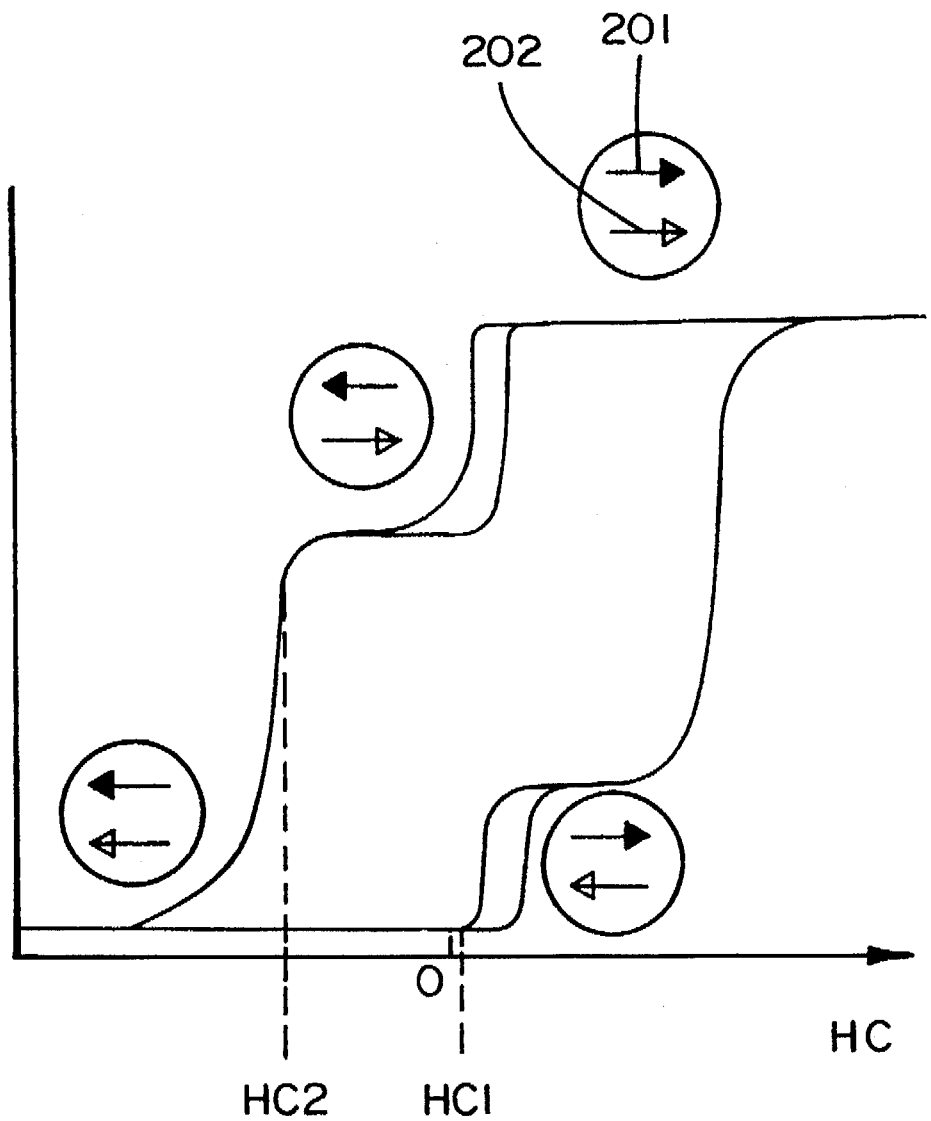
FIG. 2 is a graph showing B-H curve of an artificial lattice shown in FIG. 1.

In FIG. 2, HC1 indicates coercive force of the lower magnetic layer 101 and HC2 indicates coercive force of the upper magnetic layer which is the combination of the iron layer 103 and the nickel layer 104. Arrows 201 in circles indicate magnetizing direction of the lower magnetic layer 101 and arrows 202 indicate magnetizing direction in the upper magnetic layer. In this case, the magnetizing directions of the upper and lower magnetic layers in a magnetic field whose intensity is HC2 or more, that is, HC (Fe/Ne) or more, are coincident with the direction of the external magnetic field and the magnetizing directions between the magnetic layers are parallel (in the same direction). On the other hand, when the external magnetic field strength is in between HG and HC2, only the lower magnetic layer 101 whose coercive force is small is magnetized. Therefore, the magnetizing directions between the two magnetic layers are not parallel since the upper magnetic layer is not magnetized.

Magnetoresistances of the two magnetic layers in cases where magnetizing directions thereof are in parallel and where they are non-parallel are disclosed in R. E. Camley, et al, "Theory of Giant Magneto-resistance Effects in Magnetic Layered Structure with Antiferromagnetic Coupling", Phys. Rev. Lett. Vol. 63, No. 6 (1989), P664. These can be calculated by solving the Boltzmann transport equation.

Figure 3:
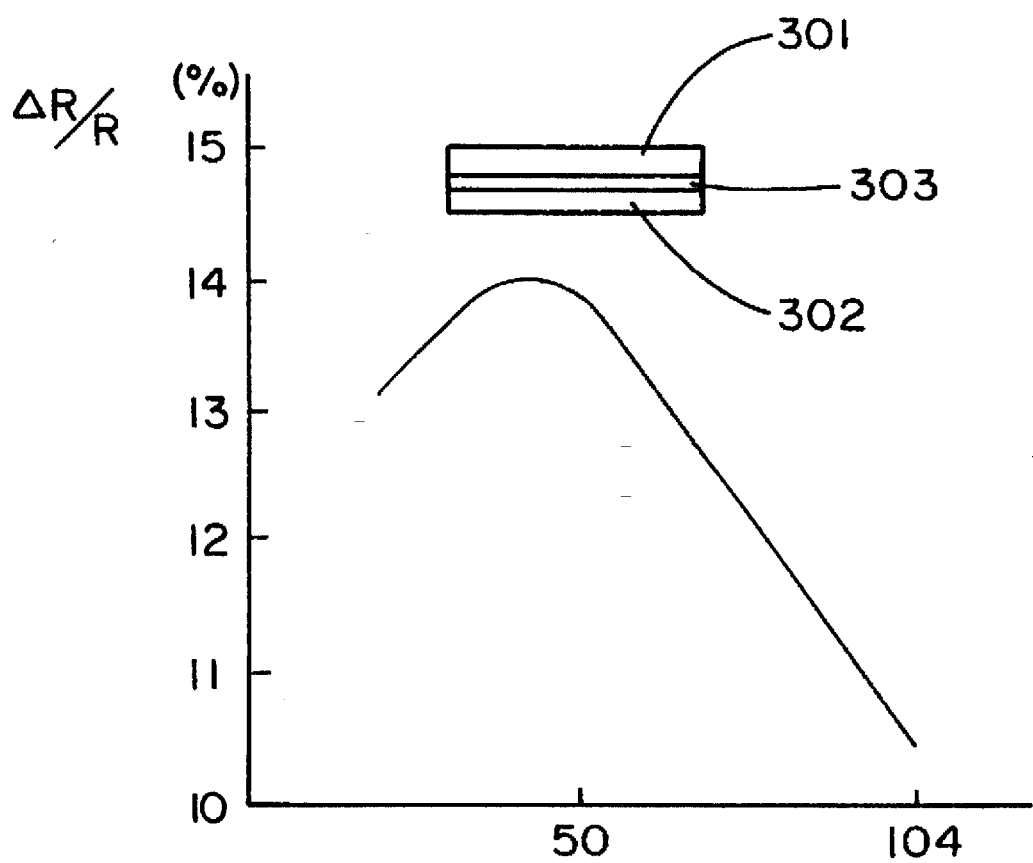
FIG. 3 shows a simulation according to Boltzmann transport equation.

FIG. 3 shows an example of the calculation result. In this case, in order to simplify the calculation, the lamination is assumed as A (magnetic layer: NiFe) 301/B (non-magnetic layer: Ag of 10A) 303/A (magnetic layer: NiFe) 302.

As is clear from FIG. 3, it is possible to obtain the magnetoresistance change rate exceeding 10% for the magnetic layer whose film thickness is within 0 to 10 nm. On the other hand, when the thickness of the non-magnetic Ag layer is smaller than 5 nm, the upper and lower magnetic layers are subjected to antiferromagnetic coupling with which there is no clear steps of HC1 and HC2 on the magnetization loop. According to Boltzmann transport equation, the maximum magnetoresistance change rate is obtained with the thickness of the magnetic layer being about 5 nm and it decreases with increase of the thickness from this value.

On the other hand, it is practically difficult, in forming a film, to control thickness thereof to 3 nm or smaller. Therefore, in order to obtain both the ideal magnetization loop and magnetoresistance characteristics, the thickness of the magnetic layer may be set in a range from 3 nm to 10 nm. In this embodiment, in order to restrict the demagnetizing field and increase the specific resistance as large as possible, the thickness of the magnetic layer in a range from 5 nm to 7 nm is excluded. Therefore, the thickness of the non-magnetic layer is preferably 5 nm or more.

Figure 4:
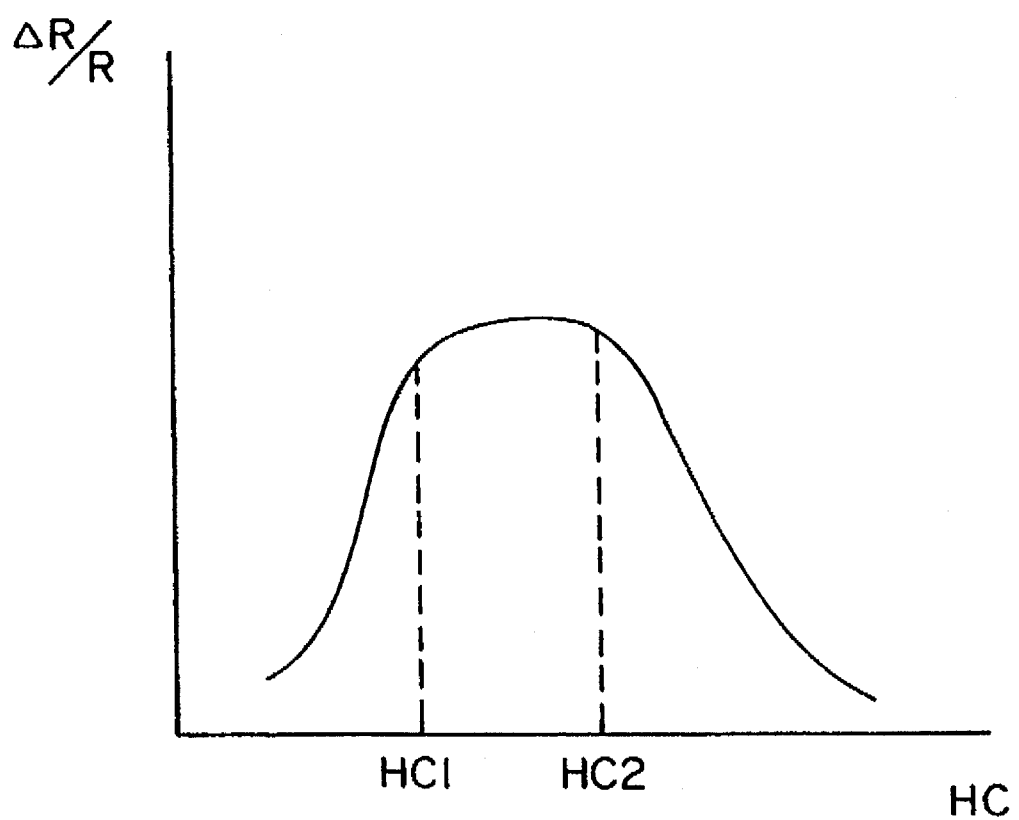
FIG. 4 shows an example of R-H curve of the magnetic sensor according to the present invention.

FIG. 4 is a graph showing relatively a relation between a variation of resistivity (or resistance value R) and the magnetic field strength including HC1 and HC2. As shown in FIG. 4, there is a clear difference in resistivity between cases where HC>HC2 or HC<HC1 and where HC1≦HC≦HC2.

There is a large difference (100 Oe or more) between HC1 which is coercive force of the layer Fe layer and HC2 which is coercive force of the lower Ni/Fe layer. When the intermediate Ag layer is thinner than 13 atomic layers, there is produced an antiferromagnetic coupling between the lower magnetic layer and the upper Ni/Fe layer. Therefore, no clear step of HC1 and HC2 appears on the magnetization curve. That is, the magnetization curve becomes similar to that of a substance having HC1=HC2. The antiferromagnetic coupling between the lower magnetic layer and the upper magnetic layer can be reduced with a plurality of minor loops on the magnetization curve thereof by making the thickness of the intermediate Ag layer to a value corresponding to 13 atomic layers and thus it becomes possible to show a magnetization curve on which HC1 and HC2 are clearly shown.

FIG. 5 shows practical basic circuit diagrams for performing a magnetoelectric conversion. The circuit shown in FIG. 5(a) is the simplest circuit in which an output is derived from an output terminal 17 at an intermediate point between series connected two elements 501 and 502 as a voltage. A power source terminal 1 is connected to the element 501 and the element 502 is connected to a ground terminal 10. The circuit shown in FIG. 5(b) is constituted with a pair of the circuits each shown in FIG. 5(a) and bridge-connected. In the circuit in FIG. 5(b), reference numerals 2 and 3 are power supply terminals, 11 and 12 ground terminals and 18 and 19 output terminals. This circuit is to obtain a larger output than that in the circuit shown in FIG. 5(a). In FIG. 5(c), two artificial lattice elements 507 and 508 are connected to collectors of transistors 513 and 514, respectively. The transistors 513, 514 and another transistor 515 form a current mirror circuit.

An output obtainable by the circuit shown in FIG. 5(c) is similar to that obtainable by the circuit shown in FIG. 5(b).

However, the circuit in FIG. 5(c) is advantageous over that shown in FIG. 5(b) in that the number of the multi layer is two and so it is possible to make the whole circuit compact. FIG. 5(d) shows a modification of the circuit shown in FIG. 5(c). The circuit shown in FIG. 5(d) further includes artificial lattice elements 510 and 512 connected to emitters of transistors 516 and 517, respectively.

It is usual to arrange the artificial lattice elements 509 to 512 with respect to a magnet such that the lattice elements 509 and 512 change in same phases and the lattice elements 510 and 511 change in opposite phases. In such case, the magnetoelectric conversion efficiency is substantially improved and the magnitude of output becomes at least three times that obtained by the circuit shown in FIG. 5(b) or 5 (c).

Figure 6:
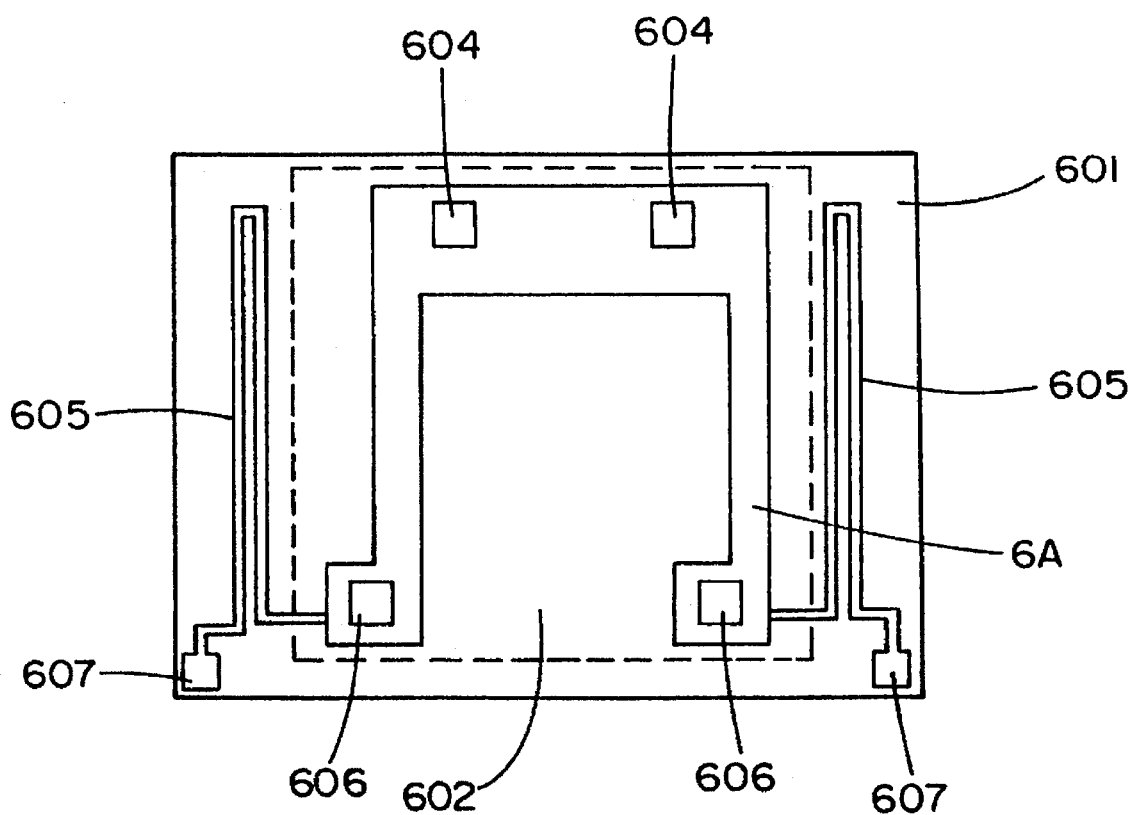
FIG. 6 is a plan view of an artificial lattice film having a lamination of ultra thin films according to a first embodiment of the present invention and integrated on a semiconductor circuit.

FIG. 6 shows an embodiment in which an artificial lattice film formed by laminating ultra thin films is integrated with a semiconductor circuit. In FIG. 6, A bipolar or MOS type integrated circuit 602 is formed in a silicon (Si) substrate 601 and an insulating film of silicon nitride (SIN) is formed on an upper surface of the integrated circuit 602. On the insulating film, a conductor wiring 6A composed of a lamination of an multi layer film 6A1 and a gold (Au) film 6A2 is formed.

Figure 7:
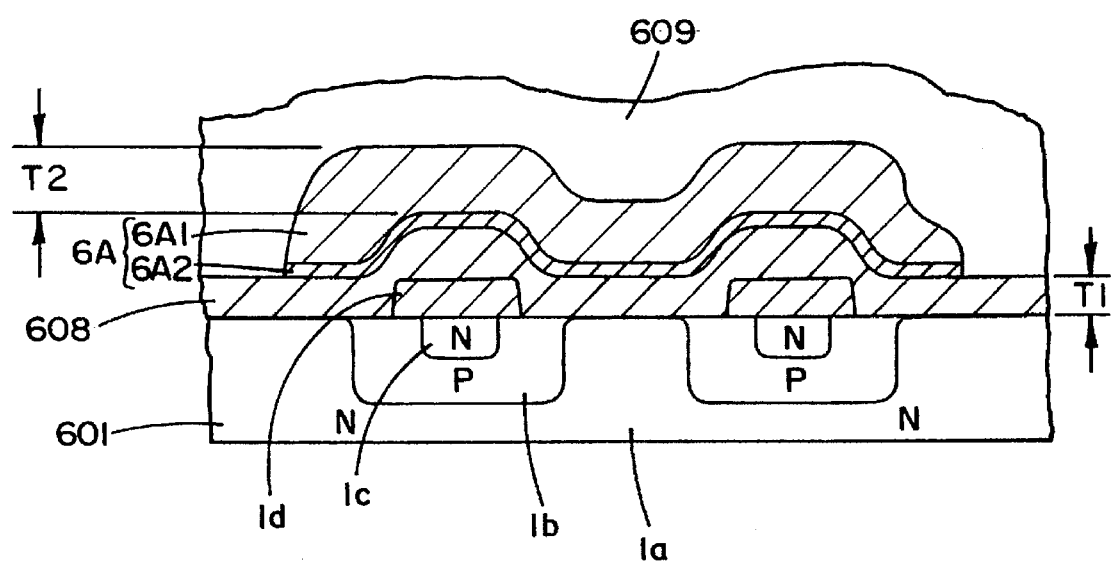
FIG. 7 is an enlarged cross section of a main portion of the integrated circuit shown in FIG. 6.
Figure 8:
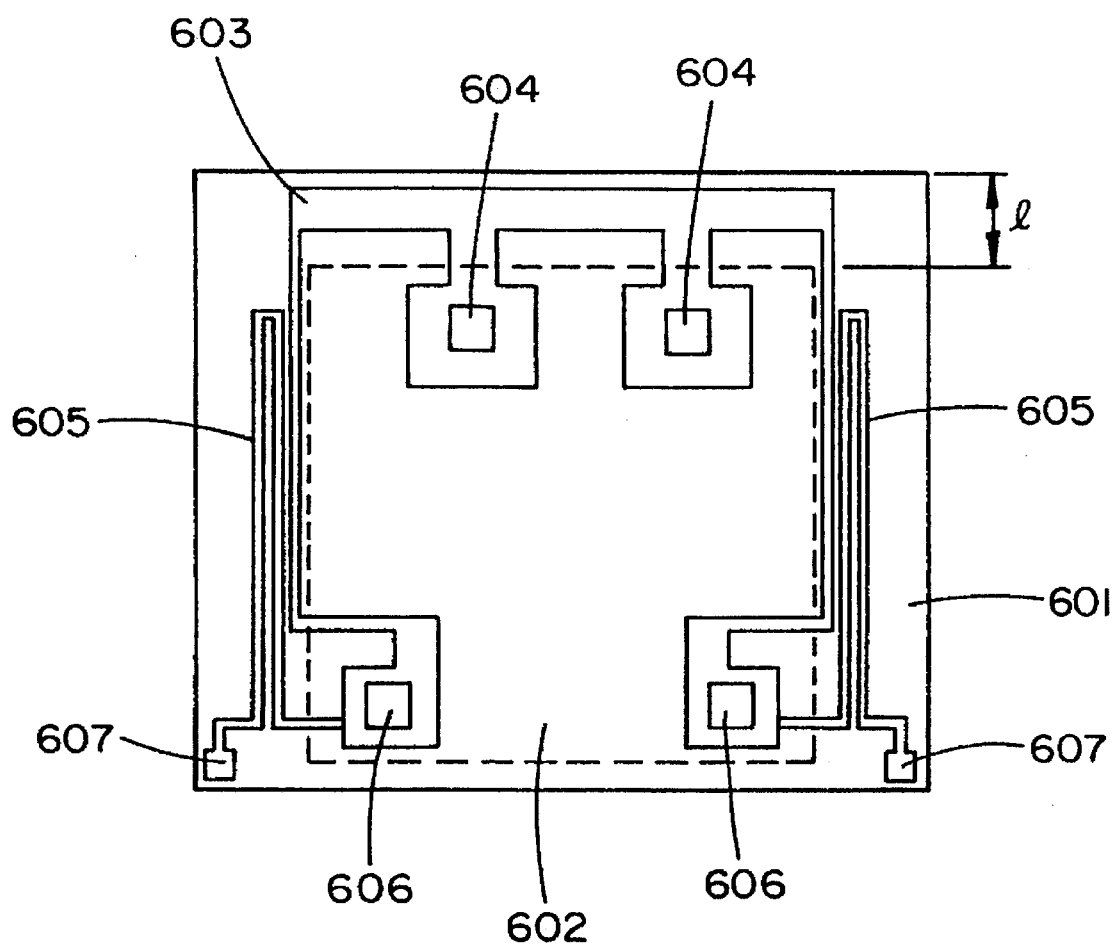
FIG. 8 is a plan view of an artificial lattice film having lamination of ultra thin films according to a second embodiment of the present invention and integrated on a semiconductor circuit.

FIG. 7 is an enlarged cross section of a main portion of the integrated circuit shown in FIG. 6. In FIG. 7, the integrated circuit 602 formed in the substrate 601 is constructed with a diffusion layer 1a, a P type layer 1b, an N type layer 1c and an electrode wiring layer 1d of aluminum (Al). An insulating film 608 of SiN is formed on the integrated circuit 602 except portions thereof on which connecting pads 604 and 606 are formed. On the insulating film 608 on the integrated circuit 602, the conductor wiring 6A thicker than the electrode wiring layer 1d is formed in close proximity to the electrode wiring 1d by means of evaporation. Further, a surface protective film 609 is formed on the wiring 6A. In this case, the thickness T2 of the wiring 6A satisfies a relation, T2>1.3T1, where T1 is thickness of the electrode wiring 1d.

In the embodiment of the present invention mentioned above, the intermediate non-magnetic layer may be of other material than silver. For example, copper, palladium or titanium can be used therefor with similar effect to that obtained with silver.

As described hereinbefore, the thin film magnetic sensor according to the present invention has the region for converting a magnetic signal from a magnetized member into an electric signal and detecting a movement of the member on the basis of the electric signal is constructed with the lamination of the first magnetic layer, the intermediate non-magnetic layer and the second magnetic layer composed of ultra thin films of magnetic material. Particularly, the first and second magnetic layer each has a thickness not smaller than 3 nm and not larger than 10 nm and the intermediate non-magnetic layer has a thickness of not smaller than 3 nm. With such construction, it is possible to obtain the magneto-resistance change rate which is substantially larger than that obtainable in the conventional sensor and thus it is possible to detect a movement of a magnetized member moving at high speed.

While this invention has been described in connection with certain preferred embodiments, it is to be understood that the subject matter encompassed by way of this invention is not to be limited to those specific embodiments. On the contrary, it is intended for the subject matter of the invention to include all alternative, modification and equivalents as can be included within the spirit and scope of the following claims.

What is claimed is:

1. A multi layer thin film magnetic sensor comprising:
   first and second regions for converting magnetic signals from magnetized members into electronic signals and for detecting moving conditions of said magnetized members; and
   first and second transistors having interconnected bases, wherein said first and second regions are connected to collectors of said first and second transistors, respectively;
   wherein each of said first and second regions includes first laminated layers, said first laminated layers comprising:
      a first magnetic layer formed of laminations of ultra thin films of a first magnetic material;
      a second magnetic layer formed of laminations of ultra thin films of a second magnetic material; and
      an intermediate non-magnetic layer formed of laminations of ultra thin films of a first non-magnetic material, said intermediate non-magnetic layer being disposed between said first and second magnetic layers.

2. The multi layer thin film magnetic sensor claimed in claim 1, wherein thickness of each of said first and second magnetic layers is in a range from 3 nm to 10 nm.

3. The multi layer thin film magnetic sensor claimed in claim 2, wherein thickness of said intermediate non-magnetic layer is 5 nm or more.

4. The multi layer thin film magnetic sensor claimed in claim 3, wherein each of said first and second magnetic layers is made of nickel.

5. The multi layer thin film magnetic sensor claimed in claim 3, wherein said second magnetic layer is made of iron.

6. The multi layer thin film mangetic sensor claimed in claim 3, wherein said second magnetic layer is made of an alloy of nickel and iron.

7. The multi layer thin film magnetic sensor claimed in claim 3, wherein said intermediate non-magnetic layer is made of silver.

8. The multi layer thin film magnetic sensor claimed in claim 3, wherein said intermediate non-magnetic layer is made of copper, palladium or titanium.

9. The multi layer thin film magnetic sensor claimed in claim 3, wherein said first laminated layers are formed on a wafer in which a circuit is formed, through an insulating film formed on said circuit.

10. The multi layer thin film magnetic sensor claimed in claim 1 further comprising:
    a semiconductor substrate, said first and second regions, and said first and second transistors being formed on said semiconductor substrate;
    a conductive wiring layer formed on said semiconductor substrate; and
    an insulating layer for separating said conductive wiring layer from said first and second transistors.

11. The multi layer thin film magnetic sensor claimed in claim 1 further comprising third and fourth regions connected to emitters of said first and second transistors, respectively, wherein said third and fourth regions include second laminated layers, said second laminated layers comprising:
    a third magnetic layer formed of laminations of ultra thin films of a third magnetic material;
    a fourth magnetic layer formed of laminations of ultra thin films of a fourth magnetic material; and
    an intermediate non-magnetic layer formed of laminations of ultra thin films of a second non-magnetic material and disposed between said third and fourth magnetic layers.

12. The multi layer thin film magnetic sensor claimed in claim 11, wherein said first and fourth regions change in a first phase, and said second and third regions change in a second phase, said first phase being opposite from said second phase.

* * * * *